United States Patent [19]

Nakaizumi

[11] Patent Number: 4,825,415
[45] Date of Patent: Apr. 25, 1989

[54] SIGNAL INPUT CIRCUIT HAVING SIGNAL LATCH FUNCTION

[75] Inventor: Kazuo Nakaizumi, Tokyo, Japan

[73] Assignee: NEC Corporation, Tokyo, Japan

[21] Appl. No.: 938,915

[22] Filed: Dec. 8, 1986

[30] Foreign Application Priority Data

Dec. 6, 1985 [JP]  Japan ................................ 60-275421

[51] Int. Cl.$^4$ ........................ G11C 7/00; G11C 11/40
[52] U.S. Cl. .................................... 365/189; 307/475
[58] Field of Search ............... 365/189, 190; 307/475, 307/481

[56] References Cited

U.S. PATENT DOCUMENTS

| | | | |
|---|---|---|---|
| 3,921,011 | 11/1975 | Orgill | 307/481 X |
| 4,654,826 | 3/1987 | Yamanouchi et al. | 365/189 |
| 4,698,526 | 10/1987 | Allan | 307/475 |
| 4,703,200 | 10/1987 | Zangara | 307/481 X |

*Primary Examiner*—Stuart N. Hecker
*Assistant Examiner*—Alyssa H. Bowler
*Attorney, Agent, or Firm*—Sughrue, Mion, Zinn, Macpeak and Seas

[57] ABSTRACT

A signal input circuit of a signal latch type includes a switch connected between a signal input terminal and a first node and first and second inverters connected in cascade between the first node and an output node, the output node being connected to the switch to control an ON/OFF state thereof. This circuit further includes a power-on reset circuit which detects the OFF state of the switch upon an application of a power voltage and changes the output node to a level that turns the switch ON.

8 Claims, 4 Drawing Sheets

SIGNAL INPUT CIRCUIT HAVING SIGNAL LATCH FUNCTION

BACKGROUND OF THE INVENTION

The present invention relates to a signal input circuit receiving an external control signal, and more particularly to such a circuit having a signal latch function.

A signal input circuit is provided between an input terminal supplied with an external control signal and an internal circuit utilizing the control signal for a purpose of wave-shaping of the control signal, for example. If the signal input circuit further has a signal latch function, there have been disadvantages that the supply period of the control signal is made short and the supply timing of the control signal with respect to another or other external control signals is not restricted.

A prototype signal input circuit considered by the inventor for the purpose of a signal latch function includes two inverters coupled in cascade and a switch composed of a transistor. The switch is connected between the input terminal and an input end of the first inverter, and an output end of the second inverter is connected to the internal circuit and further to a control end of the first switch.

When the control signal supplied to the input terminal appears at the output end of the second inverter, it is fed back to the first switch, so that the first switch is turned OFF. The input terminal is thereby disconnected from the first inverter. The level at the input end of the first inverter is capacitively-held by a stray capacitance coupled thereto, and therefore, the first and second inverters hold their output levels. The supplied control signal is thus latched by the signal input circuit. Accordingly, the control signal can disappear before the operation of the internal circuit finishes.

As a result of investigating this prototype signal input circuit, the inventor has discovered that this circuit is brought into a defective condition of refusing to enter the control signal when a power switch is turned ON to supply a power voltage to the inverters. More specifically, when the power switch is turned OFF to remove the power voltage from the inverter, they do not operate. Accordingly, all electric charges at the respective ends of the inverters and the switch are discharged. If the discharged level at the control terminal of the switch turns it OFF, this OFF-state of the switch is maintained by the feedback loop including the inverters in response to the power switching-on. As a result, the signal input circuit disconnects the input terminal and refuses to enter the control signal.

SUMMARY OF THE INVENTION

Therefore, an object of the present invention is to provide an improved signal input circuit having a signal latch function.

Another object of the present invention is to provide a signal input circuit equipped with a reset circuit responsive to power switching-on.

A signal input circuit according to the present invention comprises an input terminal supplied with a control signal, a first node, a switch coupled between the input terminal and the first node, an output node, first and second inverters coupled in cascade between the first and output nodes, means for applying a level of the output node to the switch, means for applying a power voltage to the first and second inverters, and means responsive to an application of the power voltage for making the output node to take a level that renders the switch conductive.

The switch is controlled by a level at the output node, which level takes such a value that makes the switch non-conductive when the power voltage is not applied. The level at the output node is forcibly changed to a value that renders the switch conductive in response to the application of the power voltage. The switch is thereby turned to be conductive, so that a signal applied to the input terminal can be transferred to the first node.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

In the following, the present invention will be described in detail with reference to drawings in which all of the insulated field effect transistors are of an N-channel type and all of the logic circuits and blocks are composed of insulated field effect transistors. However, the present invention is not limited to such constructions.

Figure 1:
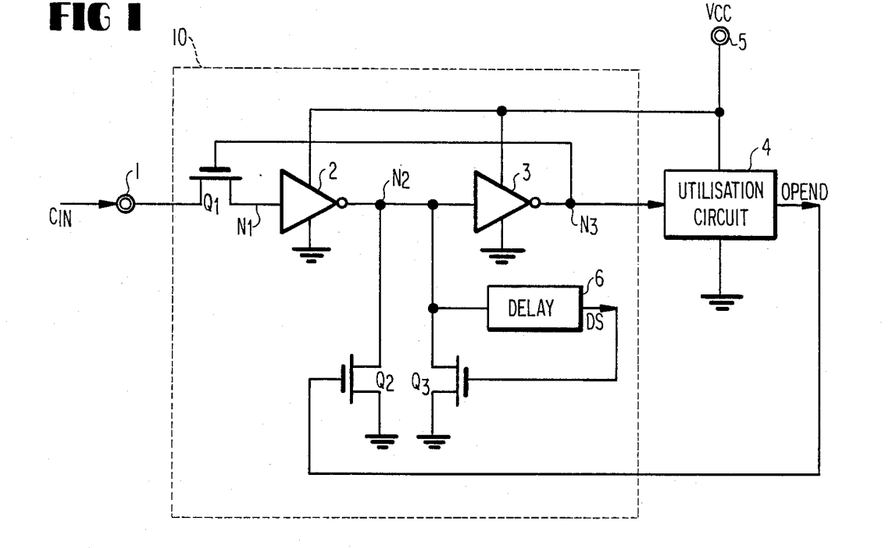
FIG. 1 is a circuit diagram showing a first embodiment of the present invention.

With reference to FIG. 1, a control signal $C_{IN}$ is supplied to an input terminal 1 which is in turn connected to a utilization circuit 4 through a signal input circuit 10 according to a first embodiment of the present invention. The signal input circuit 10 includes three transistors $Q_1$ to $Q_3$, two inverters 2 and 3 and a delay circuit 6. The source-drain path of the transistor $Q_1$ is connected between the input circuit $Q_1$ and a first node $N_1$ which is in turn connected to the input end of the inverter 2. The output end of the inverter 2 and the input end of the inverter 3 are connected in common to a second node $N_2$. The output end of the inverter 3 is connected to a third node $N_3$ which is in turn connected to the input end of the utilization circuit 4 and further to the gate of the transistor $Q_1$. The source-drain paths of the transistors $Q_2$ and $Q_3$ are connected in parallel between the node $N_2$ and a ground point. The gate of the transistor $Q_2$ is connected to the utilization circuit 4 to receive a operation end signal OPEND therefrom. The signal OPEND is generated when the circuit 4 finishes its circuit operation based upon the control signal $C_{IN}$. The node $N_2$ is further connected to the gate of the transistor $Q_3$ via the delay circuit 6. The inverters 2 and 3 and the utilization circuit 4 receivers a power voltage $V_{cc}$ having a positive value through a power terminal 5.

The utilization circuit 4 begins to carry out its circuit operation in synchronism with the change of the signal supplied to the input end thereof from a high level to a low level. In the following description, the high level takes the $V_{cc}$ level and the low level takes the ground level. When the signal supplied to the circuit 4 takes or returns to the high level, the circuit 4 is reset to take an initial state. Therefore, if the signal input circuit 10 is omitted to connect the input terminal 1 directly to the input end of the utilization circuit 4, the control signal $C_{IN}$ should maintain the low level until the circuit 4 produces the operation end signal OPEND.

In order to remove such a restriction, the signal input circuit 10 detects the level of the control signal $C_{IN}$ and latches the low level thereof until the signal OPEND is generated. When the control signal $C_{IN}$ is in the high level, the transistor $Q_1$ is brought into an ON-state. Accordingly, the nodes $N_1$, $N_2$ and $N_3$ takes the high level, low level and high level, respectively, as shown in FIG. 2.

Figure 2:
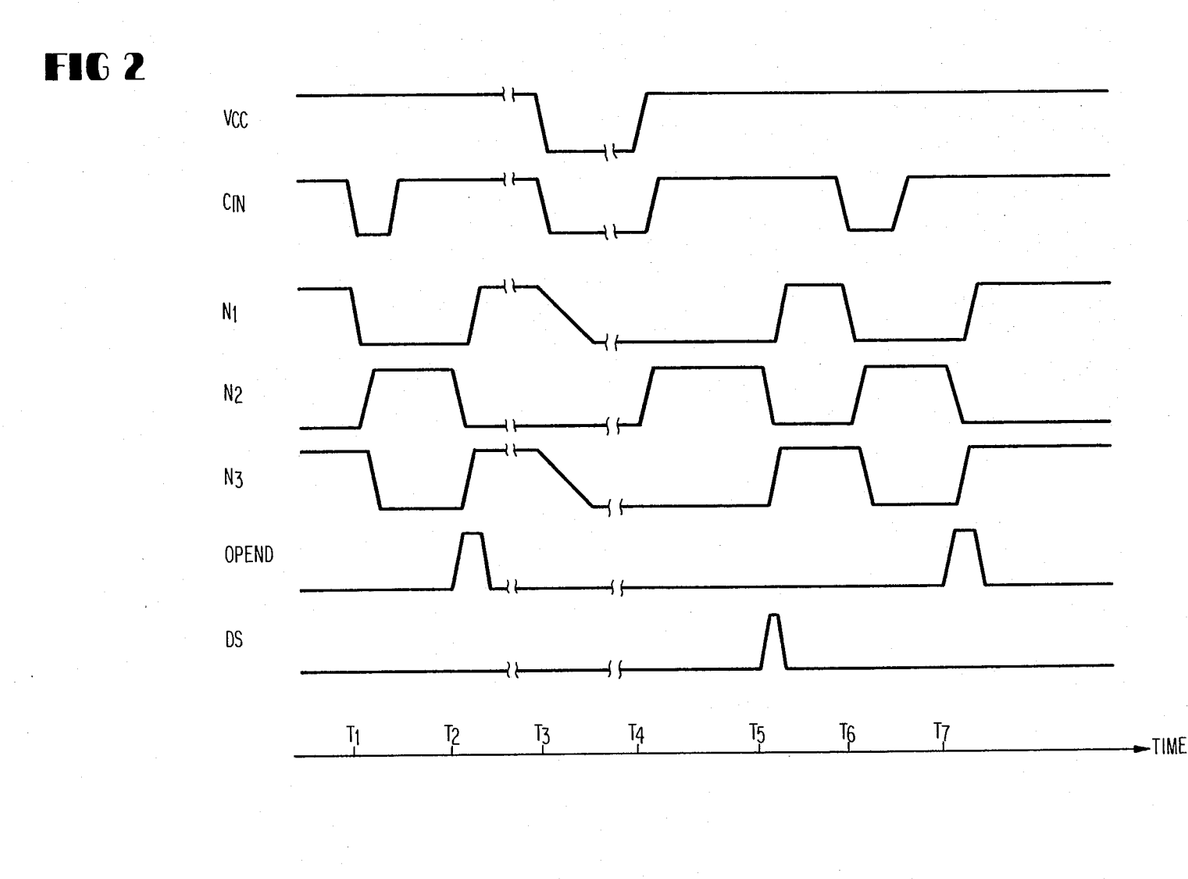
FIG. 2 is a timing chart for explaining an operation of the circuit shown in FIG. 1.

When the control signal $C_{IN}$ changes to the low level at a first time point $T_1$ shown in FIG. 2, the node $N_1$ takes the low level in response thereto, so that the nodes $N_2$ and $N_3$ is changed respectively to the high level and the low level, respectively. The utilization circuit 4 thereby begins to carry out its circuit operation. The low level at the node $N_3$ is fed back to the gate of the transistor $Q_1$ to turn it OFF. The input terminal is thus disconnected from the node $N_1$. Therefore, the control signal $C_{IN}$ returns to the high level before the signal OPEND is generated, as shown in FIG. 2. Since the low level at the node $N_2$ is held by a stray capacitance coupled thereto, the nodes $N_2$ and $N_3$ maintain the high level and low level, respectively. That is, the low level of the control signal $C_{IN}$ is latched. When the utilization circuit 4 finishes its circuit operation to produce the signal OPEND at a second time point $T_2$ in FIG. 2, the transistor $Q_2$ is turned ON, so that the node $N_2$ is discharged to the low level. The node $N_3$ is changed to the high level by the inverter 3. The transistor $Q_3$ is thereby turned ON to connect the input terminal 1 to the node $N_1$ which is then charged to the high level. Thus, the level latching operation of the signal input circuit 10 is cancelled, and the circuit 10 awaits a subsequent change of the signal $C_{IN}$ to the low level.

The delay circuit 6 responds to the high level at the node $N_2$ and produces a high level delay signal SD after a predetermined delay period has elapsed. This delay period is designed to be longer than a time period from the first time point $T_1$ to the second time point $T_2$, or, a time period that is required by the utilization circuit 4 to complete its operation started by the application of the control signal $C_{IN}$. Moreover, the delay circuit 6 responds to the change at the node $N_2$ from the high level to the low level and resets its signal delay operation at a moment. Accordingly, the signal DS is not generated from the delay circuit 6 under a steady operation condition. The delay circuit 6 may be of an inverter type that outputs an inverted signal of a signal at its input end after delay period from the application of the signal to its input end. In that case, the input end of the delay circuit 6 is connected, not to the node (e.g., $N_2$) to which the transistor $Q_3$ is connected, but to a node (e.g., $N_1$ or $N_3$) which takes an opposite level of the level of the node $N_1$.

When a power switch (not shown) is turned OFF to remove the power voltage $V_{cc}$ from the terminal 5 at a third time point $T_3$ in FIG. 2, the utilization circuit 4 and the inverter 2 and 3 does not operate, and the control signal $C_{IN}$ disappears to change the input terminal 1 to the low level. Accordingly, the nodes $N_1$ and $N_3$ are discharged naturally, so that all of the nodes $N_1$ to $N_3$ take the low level, as shown in FIG. 2. The transistor $Q_1$ is thereby turned OFF.

The power switch is turned ON at a fourth time point $T_4$ to supply the power voltage $V_{cc}$ to the terminal 5. At this time, since the node $N_3$ is in the low level, the transistor $Q_5$ takes the OFF-state. For this reason, the node $N_1$ holds the low level irrespective of the level of the control signal $C_{IN}$. Since the inverters 2 and 3 receive the power voltage $V_{cc}$, the inverter 2 changes the node $N_2$ to the high level and the inverter 3 maintains the node $N_3$ at the low level, as shown in FIG. 2. Therefore, the transistor $Q_1$ is held at the OFF-state. Since the utilization circuit 4 is brought into the initial state by the high level input, it does not perform its predetermined circuit operation and not produce the signal OPEND. Thus, the signal input circuit 10 refuses to enter the control signal in response to power switching-ON. Therefore, the circuit 4 does not operate.

In order to cancel such a defective condition, the delay circuit 6 and the transistor $Q_3$ are provided. When the signal input circuit takes the above-mentioned defective condition, the node $N_2$ is maintained at the high level, and therefore the delay circuit 6 produces the high level delay signal DS at a fifth time point $T_5$ shown in FIG. 2. The transistor $Q_3$ is thereby turned ON to discharge the node $N_2$. The inverter 3 changes the node $N_3$ to the high level that is in turn fed back to the transistor $Q_1$. Accordingly, the transistor $Q_1$ is turned ON and the node $N_1$ takes the high level in response to the high level control signal $C_{IN}$. The inverters 2 and 3 hold the nodes $N_2$ and $N_3$ at the low level and the high level, respectively. When the node $N_2$ changes to the low level, the signal DS is inverted momentarily to the low level. The utilization circuit 4 is thereby brought into its initial state.

When the control signal $C_{IN}$ changes to the low level at a time point $T_6$, the signal input circuit 10 latches that low level and disconnects the input terminal 1 from the circuit 4. At this point $T_7$, the signal OPEND is generated from the circuit 4, so that the signal input circuit 10 awaits a subsequent change of the control signal $C_{IN}$ to the low level, as shown in FIG. 2.

If desired, a third inverter may be added which has its input end connected to the second node $N_2$ and its output end connected to the first node $N_1$. That is, the second inverter 2 and the added third inverter constitutes a flip-flop circuit. It is possible to use one transistor in common for the transistors $Q_2$ and $Q_3$. To this end, an OR gate is provided to receive the signals DS and OPEND and the output thereof is supplied to the gate of the transistor whose source-drain path is connected between the node $N_2$ and the ground.

Figure 3:
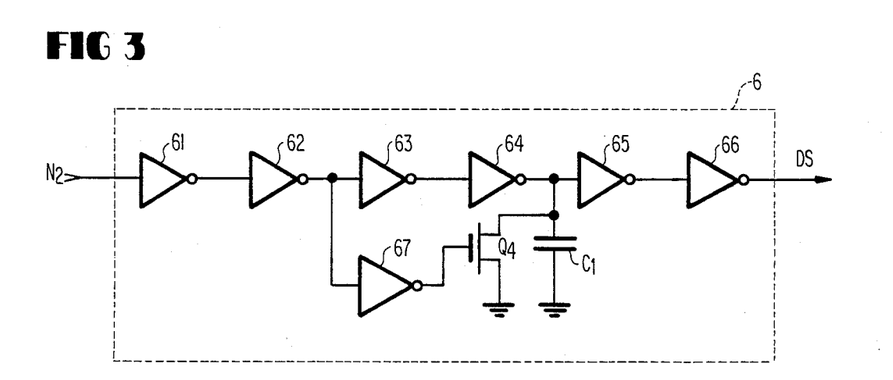
FIG. 3 is a circuit diagram representing a delay circuit shown in FIG. 1.

As shown in FIG. 3, the delay circuit 6 includes seven inverters 61 to 67, one capacitor $C_1$ and one transistor $Q_4$. The inverters 61 to 66 are connected in cascade between the input and output ends of the circuit 6. The capacitor $C_1$ and the transistor $Q_4$ are connected in parallel between the output end of the inverter 64 and the ground point, and the inverter 67 is connected between the output end of the inverter 62 and the gate of the transistor $Q_4$. The conductance of the transistor $Q_4'$ is designed to be considerably large. Therefore, the circuit 6 responds to the high level at the node $N_2$ and produces the high level signal DS after a delay of time determined by the gate delays of the respective inverters and the capacitor $C_1$. When the node $N_2$ changes to the low level, the capacitor $C_1$ is discharged rapidly to invert the signal DS to the low level at a moment.

Figure 4:
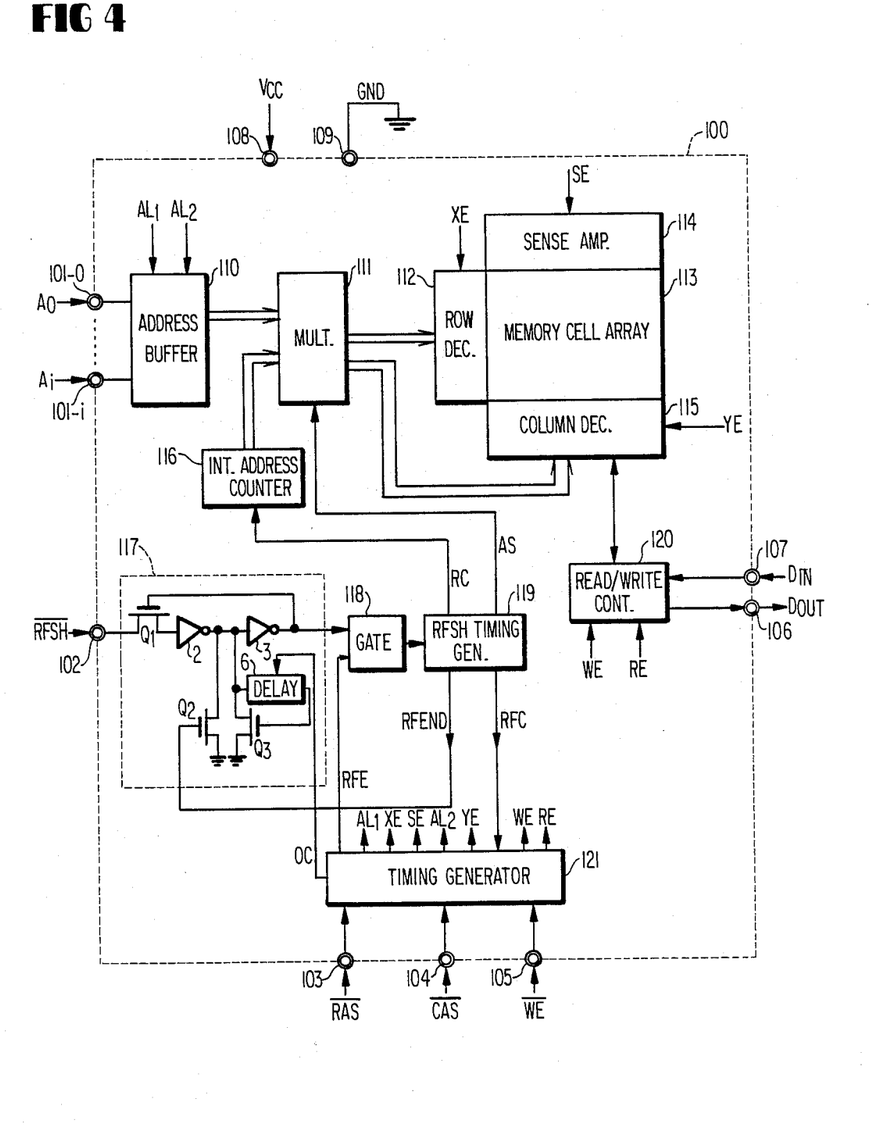
FIG. 4 is a block diagram showing a semiconductor dynamic random access memory as a second embodiment of the present invention.

Referring to FIG. 4, a semiconductor dynamic random access memory is shown as a second embodiment of the present invention. This memory is of a multi-address input type and fabricated as an integrated circuit device 100. Address signals Ao to Ai are supplied respectively to address input terminals 101-o to 101-i. When a row address strobe signal $\overline{RAS}$ supplied to a row strobe input terminal 103 changes to the low level, a timing generator 121 generates a first address latch signal $AL_1$, a row decoder-enable signal AE and a sense-enable signal SE. In response to the signal $AL_1$, an address buffer 110 introduces the address signals Ao to Ai as row address information and supplies them to a multiplex 111. In a data-read or data-write operation, the multiplexer 111 selects the data from the buffer 110. A memory cell array 113 includes a plurality of word and digit lines and a plurality of memory cells (all not shown). Each of the memory cells is of a so-called one-transistor memory cell type composed of one transistor and one capacitor and is connected between one of the word lines and one of the digit lines. The output of the multiplexer 111 is supplied to a row address decoder 112 which is energized by the signal XE, so that one of the word lines is selected by the decoder 112 in response to the row address. A sense amplifier 114 is energized by the signal SE and refreshes the memory cells connected to the selected word lines. When a column address stroke signal $\overline{CAS}$ supplied to a terminal 104 changes to the low level after the change to a low level of the signal $\overline{RAS}$, the timing generator 122 generates a second address latch signal $AL_2$ and a column decoder-enable signal YE. The address buffer 110 latches the address signals Ao to Ai as column address data in response to the signal $AL_2$ and supplies them via the multiplexer 111 to a column decoder 115. Since the decoder 115 is energized by the signal YE, one of the digit lines is selected in response to the column address data. As a result, one of the memory cells is designated. In a data-write operation, a write-enable signal $\overline{WE}$ supplied to a terminal 105 takes a low level and input data $D_{IN}$ is supplied to an input terminal 107. A read-/write controller 120 responds to a write-energizing signal WE from the generator 121 and writes the data $D_{IN}$ into the designated memory cell. In a data-read operation, the signal $\overline{WE}$ takes the high level, so that the generator 121 generates a read-energizing signal RE. Accordingly, the controller 120 reads the data stored in the designated memory cell and supplies it to an output terminal 106 as an output data signal $D_{OUT}$. The memory 100 includes a power terminal 108 receiving a power voltage $V_{cc}$ and a ground terminal 109 connected to the ground.

Since charge stored in the capacitor of each memory cell is discharged by a leakage current, each memory cell is required to refresh cyclically in a data-holding mode. For this purpose, this memory further includes an internal refresh circuit composed of a refresh timing generator 119 and an internal address counter 116 and controlled by a refresh signal $\overline{RFSH}$ supplied to a terminal 102. The refresh timing generator 119 responds to a change from the high level to the low level of a signal supplied to an input end thereof and generates a refresh control signal RFC and an address selection signal AS. The timing generator 121 responds to the signal RFC and generates only the signals XE and SE. The multiplexer 111 selects the data from the internal counter 116 in place of the buffer 110 in response to the signal AS and supplied it to the row decoder 112. As a result, one of the word lines is selected by the decoder 112 in response to the data from the counter 116 and the memory cells connected to the selected word line are refreshed. When the refresh operation finished, the generator 119 generates a counter control signal RC and a refresh end signal RFEND. In response to the signal RC, the counter 116 changes its count value by one.

The refresh operation by the internal refresh circuit must not be carried out during a period of data-read and data-write operations. For this reason, the refresh signal $\overline{RFSH}$ should be supplied after the row and column address strobe signals $\overline{RAS}$ and $\overline{CAS}$ have returned to the high level.

In order to remove this restriction, an signal input circuit 117 according to the present invention and a gate circuit 118 are provided. The signal input circuit 117 has the same construction as the circuit 10 shown in FIG. 1 except that the delay circuit 6 is further supplied with a delay control signal DC from the timing generator 121, and therefore the constitutents thereof are denoted by the same reference numerals and symbols to omit their further description. The output of the circuit 117 is supplied to a first input end of the gate circuit whose a second input end receiving a refresh-enable signal RFE which is generated from the generator 121 when the data-read or data-write operations are completed. Since the signal $\overline{RFSH}$ is latched by the circuit 117, it can change to the low level during a period of time when the data-read or data-write operation is being carried out. The signal DC is generated when the data-read or data-write operation is carried out and deactivates the delay circuit 6. Therefore, the latched low level output of the circuit 117 is supplied to the gate 118, but at this time the signal RFE is not generated, and the gate 118 does not transfer the latched low level signal to the refresh timing generator 119. Accordingly, the refresh operation is not carried out. After the data-read or data-write operation ends, the latched low level signal is supplied to the refresh timing generator 119, so that the internal refresh operation is performed. When the refresh operation finishes, the signal RFEND is generated to reset the signal input circuit 117.

Moreover, since the signal input circuit 117 includes the transistor $Q_3$ and the delay circuit 6 and the delay circuit 6 is activated just after the power switching-on, there does not occur such a defective condition that the output thereof is maintained at the low level, as already mentioned with reference to FIGS. 1 and 2. The refresh timing generator 119 is reset to take its initial state by the high level derived from the circuit 117 via the gate 118.

Figure 5:
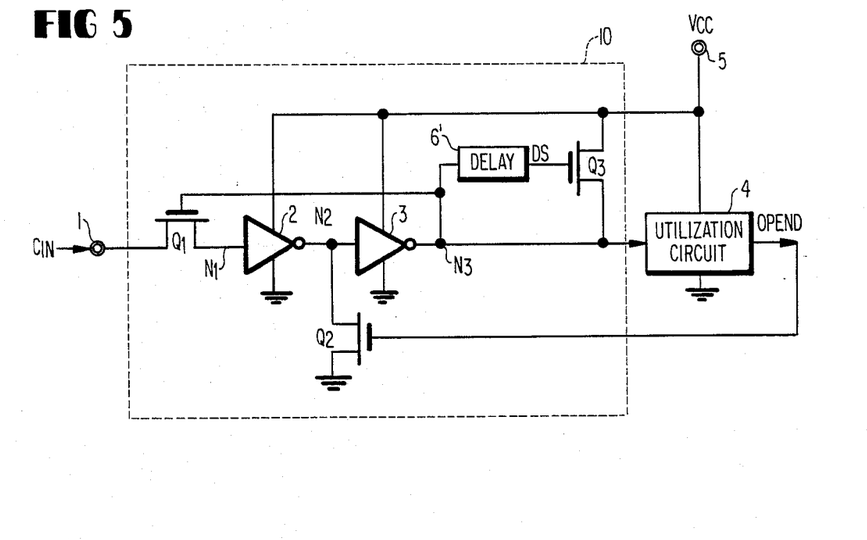
FIG. 5 is a circuit diagram representing a third embodiment of the present invention.

Referring to FIG. 5, a third embodiment of the present invention will be described below, in which the same constituents as those shown in FIG. 1 are denoted by the same reference numerals and symbols. In FIG. 5, the source-drain path of the transistor $Q_5$ is connected between the terminal 5 and the node $N_3$, and a delay circuit 6' is connected between the node $N_3$ and the gate of the transistor $Q_3$. The delay circuit 6' responds to the low level at the node $N_3$ and produces a high level delay signal DS after the utilization circuit 4 produces the operation end signal OPEND. Accordingly, the above-mentioned defective condition occurring just after the power switching-on is eliminated.

Figure 6:
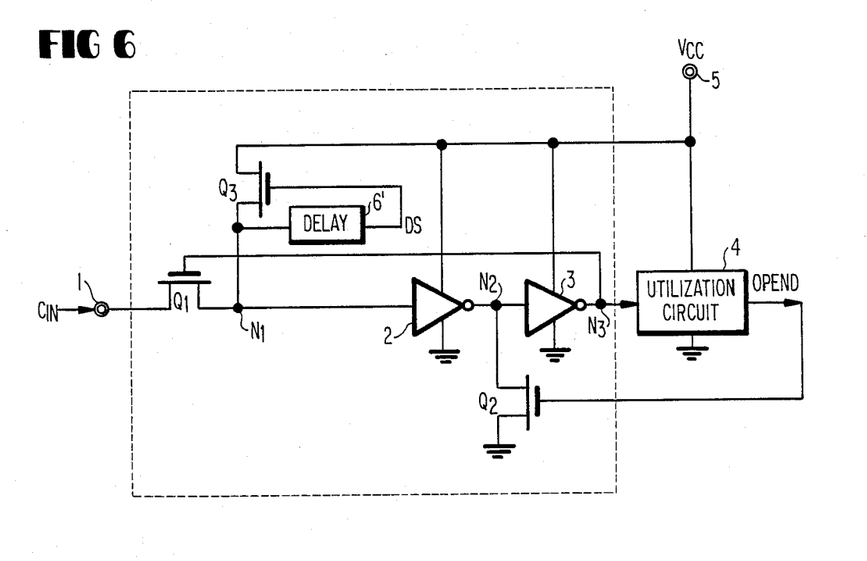
FIG. 6 is a circuit diagram of a fourth embodiment according to the present invention.

A fourth embodiment of the present invention is shown in FIG. 6, in which the source-drain path of the transistor $Q_3$ is connected between the terminal 5 and the first node $N_1$ and the delay circuit 6' is connected between the node $N_1$ and the gate of the transistor $Q_3$.

The delay circuit 6' shown in FIGS. 5 and 6 can be constituted by adding one inverter on the side of the input of the inverter 61 (see FIG. 3) or between the inverters 61 and 62.

The present invention is not limited to the above embodiments, but may be modified and changed without departing from the scope and spirit of the invention. For example, the transistor $Q_3$ in FIG. 1 may be connected to the terminal 5 and the first node $N_1$ or the third node $N_3$. Moreover, the transistor $Q_3$ in FIG. 1 may be controlled by the level at the node $N_1$ or $N_2$, as shown in FIGS. 5 and 6.

What is claimed is:

1. A signal input circuit comprising an input terminal supplied with a control signal, first and second modes, a switch coupled between said input terminal and said first node, an output node, a first inverter coupled between and first and second nodes, a second inverter coupled between said second and output nodes, means for coupling said output node to said switch such that said switch is conductive in response to a first voltage level of said output node and said switch is nonconductive in response to a second voltage level of said output node, means coupled to one of said first, second and output nodes for generating a detection signal when said output node is continuously at said second voltage level for a predetermined time period, and second means responsive to said detection signal for changing said output node from said second voltage level to said first voltage level.

2. The circuit as claimed in claim 1, wherein said first means includes a delay circuit for delaying a voltage level at said one of said first, second and output nodes and generating said detection signal after said predetermined time period elapses, and said second means includes a transistor which is made conductive in response to said detection signal to change said output node from said second voltage level to said first voltage level.

3. A signal input circuit comprising an input terminal supplied with an input signal, first, second and third nodes, a first field effect transistor having a source-drain path connected between said input terminal and said first node and a gate, a first inverter connected between said first and second nodes, a second inverter connected between said second and third nodes, means for connecting said third node to the gate of said first field effect transistor to turn said first field effect transistor on in response to a first logic level of said third node and off in response to a second logic level of said third node, a delay circuit having an input end connected to one of said first, second and third nodes and an output end, first and second power terminals, a second field effect transistor having a gate connected to the output end of said delay circuit, a source and a drain, means for connecting one of the source and drain of said second field effect transistor to one of said first and second power terminals, and means for connecting the other of the source and drain of said second field effect transistor to one of said first, second and third nodes, whereby said delay circuit turns said second field effect transistor on when said third node is held at said second logic level over a predetermined time period such that said third node is changed from said second logic level to said first logic level.

4. A signal input circuit comprising an input terminal supplied with an input signal, first, second and third nodes, a first field effect transistor having a source-drain path connected between said input terminal and said first node and a gate, a first inverter connected between said first and second nodes, a second inverter connected between said second and third nodes, means for connecting said third node to the gate of said first field effect transistor, a delay circuit having an input end connected to one of said first, second and third nodes and an output end, first and second power terminals, a second field effect transistor having a gate connected to the output end of said delay circuit, a source and a drain, means for connecting one of the source and drain of said second field effect transistor to one of said first and second power terminals, means for connecting the other of the source and drain of said second field effect transistor to one of said first, second and third nodes, a signal utilization circuit coupled to said third node, and a third field effect transistor having a source-drain path connected between said second node and said first power terminal and a gate connected to said signal utilization circuit to receive an operation end signal therefrom, said delay circuit producing a delay signal at its output end after said operation end signal is produced.

5. A signal input circuit comprising an input terminal supplied with an input signal, first, second and third nodes, a first transistor connected between said input terminal and said first node and having a control electrode, a first inverter connected between said first and second nodes, a second inverter connected between said second and third nodes, an internal circuit connected to said third node and controlled by a logic level at said third node, said internal circuit producing an operation end signal when its circuit operation finishes, first and second power terminals, a second transistor connected between said second node and said first power terminal and having a control electrode supplied with said operation end signal, means responsive to a second logic level of said third node for operating a control signal after a predetermined time period, and means responsive to said control signal for changing said third node from said second logic level to said first logic level.

6. A signal input circuit comprising an input terminal supplied with an input signal, first, second and third nodes, a first transistor connected between said input terminal and said first node, a first inverter connected between said first and second nodes, a second inverter connected between said second and third nodes, an internal circuit connected to said third node and controlled by a signal derived from said third node, said internal circuit producing an operation end signal when its circuit operation finishes, first and second power terminals, a second transistor connected between second node and said first power terminal and having a control electrode supplied with said operation end signal, a third transistor connected between said second node and said first power terminal, and a delay circuit connected between said second node and a control electrode of said third transistor, said third transistor being made conductive in response to an output of said delay circuit to change a level of said third node to turn on said first transistor.

7. A signal input circuit comprising an input terminal supplied with an input signal, first, second and third nodes, a first transistor connected between said input terminal and said first node, a first inverter connected between said first and second nodes, a second inverter connected between said second and third nodes, an internal circuit connected to said third node and controlled by a signal derived from said third node, said internal circuit producing an operation end signal when its circuit operation finishes, first and second power terminals, a second transistor connected between said second node and said first power terminal and having a control electrode supplied with said operation end signal, a third transistor connected between said third node and said second power terminal, and a delay circuit connected between said third node and a control electrode of said third transistor, said third transistor being made conductive in response to an output of said delay circuit to change a level of said third node to turn on said first transistor.

8. A signal input circuit comprising an input terminal supplied with an input signal, first, second and third nodes, a first transistor connected between said input terminal and said first node, a first inverter connected between said first and second nodes, a second inverter connected between said second and third nodes, an internal circuit connected to said third node and controlled by a signal derived from said third node, and said internal circuit producing an operation end signal when its circuit operation finishes, first and second power terminals, a second transistor connected between said second node and said first power terminal and having a control electrode supplied with said operation end signal, a third transistor connected between said first node and said second power terminal, and a delay circuit connected between said first node and a control electrode of said third transistor, said third transistor being made conductive in response to an output of said delay circuit to change a level of said third node to turn on said first transistor.

* * * * *

UNITED STATES PATENT AND TRADEMARK OFFICE
CERTIFICATE OF CORRECTION

PATENT NO. : 4,825,415
DATED : April 25, 1989
INVENTOR(S) : NAKAIZUMI

It is certified that error appears in the above-identified patent and that said Letters Patent is hereby corrected as shown below:

Column 3, line 62, delete "$N_6$" and insert --$N_2$--.

Signed and Sealed this

Sixth Day of March, 1990

Attest:

JEFFREY M. SAMUELS

*Attesting Officer*   *Acting Commissioner of Patents and Trademarks*